US007109565B2

United States Patent
Liu et al.

(10) Patent No.: US 7,109,565 B2
(45) Date of Patent: Sep. 19, 2006

(54) FINGER METAL-INSULATOR-METAL CAPACITOR DEVICE WITH LOCAL INTERCONNECT

(75) Inventors: Lenvis Liu, Hsinchu (TW); Chong Jen Hwang, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/695,167

(22) Filed: Oct. 28, 2003

(65) Prior Publication Data

US 2004/0084707 A1   May 6, 2004

Related U.S. Application Data

(62) Division of application No. 10/077,450, filed on Feb. 15, 2002, now abandoned.

(51) Int. Cl.
   *H01L 21/00* (2006.01)
(52) U.S. Cl. ........................ 257/534; 257/309
(58) Field of Classification Search ........... 257/296, 257/306, 308, 309, 532, 534
   See application file for complete search history.

(56) References Cited

U.S. PATENT DOCUMENTS

| 5,192,703 A |   | 3/1993 | Lee et al. |
|---|---|---|---|
| 5,275,974 A |   | 1/1994 | Ellul et al. |
| 5,583,359 A |   | 12/1996 | Ng et al. |
| 5,712,202 A |   | 1/1998 | Liaw et al. |
| 5,804,489 A | * | 9/1998 | Yang et al. .................. 438/396 |
| 6,080,621 A |   | 6/2000 | Wang et al. |
| 6,117,790 A |   | 9/2000 | Schäfer et al. |
| 6,153,463 A |   | 11/2000 | Wei et al. |
| 6,242,316 B1 |   | 6/2001 | Joo |
| 6,281,543 B1 | * | 8/2001 | Al-Shareef et al. ......... 257/309 |
| 6,297,527 B1 | * | 10/2001 | Agarwal et al. ............ 257/306 |
| 6,303,456 B1 |   | 10/2001 | Pricer et al. |
| 6,326,258 B1 |   | 12/2001 | Iizuka |

* cited by examiner

*Primary Examiner*—N. Drew Richards
(74) *Attorney, Agent, or Firm*—Ernest J. Beffel, Jr.; Haynes Beffel & Wolfeld LLP

(57) ABSTRACT

The present invention includes a method of constructing a novel capacitor and geometry for the capacitor. The method and device include forming a multilayer structure having what generally can be described as a wave shape. Particular aspects of the present invention are described in the claims, specification and drawings.

4 Claims, 4 Drawing Sheets

FINGER METAL-INSULATOR-METAL CAPACITOR DEVICE WITH LOCAL INTERCONNECT

RELATED APPLICATION DATA

This application is a division of U.S. patent application Ser. No. 10/077,450 entitled "Finger Metal-Insulator-Metal Capacitor with Local Interconnect," filed 15 Feb. 2002 abandoned.

BACKGROUND OF THE INVENTION

One essential component of integrated circuits is a capacitor. Design and production of capacitors trades off capacity and footprint (together determining density) with manufacturing processes. There will always be an opportunity to introduce a better capacitor design and manufacturing process.

SUMMARY OF THE INVENTION

The present invention includes methods to produce a finger metal-insulator-metal capacitor. One plate can either be a base conductive layer or overlaying or an additional, deposited layer. Capacitor formation may be integrated with formation of interconnects for other components on the same die. The resulting capacitor has a novel geometry. Particular aspects of the present invention are described in the claims, specification and drawings.

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

Figure 1:
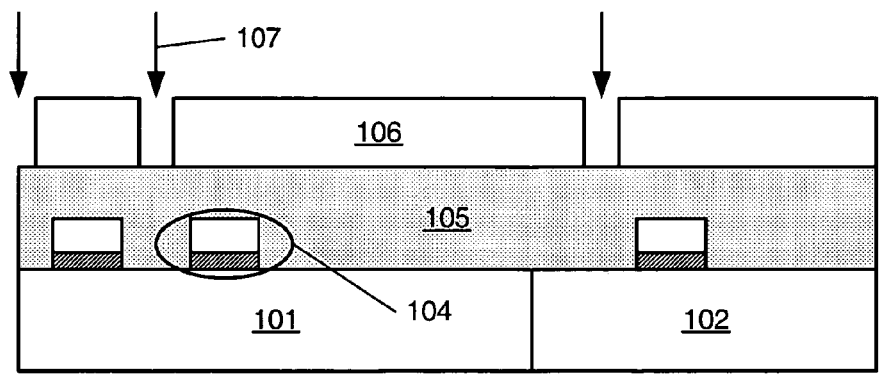
FIG. 1 is a cross section of a die with some devices already formed and covered by an insulator.

FIG. 1 is a cross section of a die with some devices already formed and covered by a base insulator. The foundation level is divided into a plurality of regions 101, 102. In some applications, a first region 101 will be an area in which metal-insulator-metal devices are formed and a second region 102 will be an area in which periphery devices are formed. The foundation level may be the substrate of the die or it may be a layer of devices. The foundation also may be a single region, instead of a plurality of regions. Several devices e.g., 104, are illustrated as being formed within the foundation level. These devices are covered by an insulator 105. This insulator layer may be a so-called inter-layer dielectric. CMP planarization may be used to smooth the insulator, prior to additional processing steps. In preparation for patterning the insulator, a patterning layer 106, such as a single or multi-layer resist has been formed over the insulator 105. In the case of resist, the patterning material is exposed by lithographic, direct write or other process and developed. An anisotropic etch such as a plasma or reactive ion etch ("RIE") 107 is illustrated. This etch transfers an exposed-pattern from the patterning layer 106 to the insulator 105.

Figure 2:
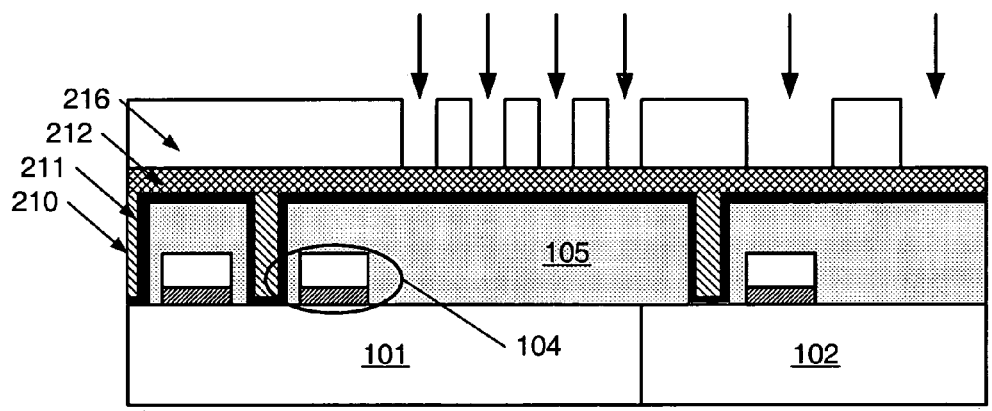
FIG. 2 is a cross section of the same die, with contacts formed and a resist layer patterned.

FIG. 2 is a cross section of the same die, with contacts formed, a base conductive layer formed, and a resist layer patterned. This figure illustrates vias resulting from the anisotropic etch 107. The vias are filled in one or more steps. This figure illustrates forming a barrier layer 211 in the vias, followed by forming a contact 210 over the barrier layer 211 and forming a base conductive or metal layer 212 over the contact layer 210 and the barrier layer 211. When tungsten, titanium, copper and aluminum are used as contacts 210 and metal layers 212, a suitable barrier layer may include titanium nitride and titanium. Barrier or interface layers can readily be selected to control migration and/or adhesion of the contact and base conductive layers. In some applications, formation of high density capacitors enables use of materials such as tungsten for a base conductive layer. Tungsten has a higher resistance than aluminum or copper and therefore is typically restricted to local interconnects, as opposed to long interconnects. More generally, the contact layer and metal, conductive layer may be any conductor, not necessarily limited to a metal. Above the contact and base conductive layers, an additional patterned layer 216 and an anisotropic etch are illustrated.

Figure 3:
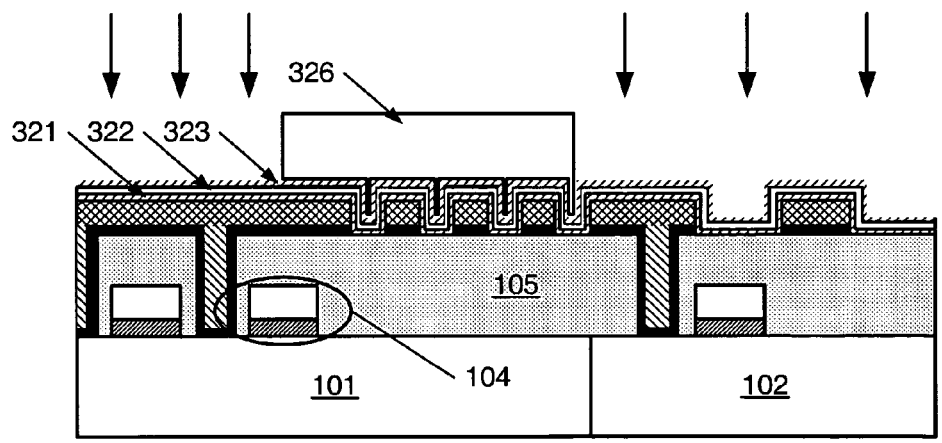
FIG. 3 is a cross section of the same die, with three layers formed for use as a capacitor.

FIG. 3 is a cross section of the same die, with three layers formed for use as a capacitor. This figure illustrates trenches resulting from the anisotropic etch illustrated in FIG. 2. The trenches may, but do not necessarily need to, cut all the way through the base conductive and barrier layers. In one embodiment, the trenches cut at least substantially through the base conductive layer. The trenches need not cut all of the way through the base conductive and barrier layers in areas where the first plate layer is being formed, because the first plate layer 321 can effectively be formed on the base conductive layer 212 or the barrier layer 211 or the base insulator 105. The trenches are filled to form at least three layers. A first plate layer 321 is formed, at least in part, on the contact 210 or base conductive layer 212. The first plate layer is contoured to the undulation or wave shape of the plurality of trenches. The undulated or wave shape, viewed in profile, may be rectangular, as illustrated, or may be more contoured, due to spacer formation along the trench edges, edge slope or other process factors. This first plate layer 321 may be formed by metal sputtering. Suitable metals include titanium nitride, or, more generally, any conductor. Alternatively, another technology such as chemical vapor deposition ("CVD") or physical vapor deposition ("PVD") may be adapted to deposit a conductive first plate layer 321. The thickness of the first plate layer may be less than the minimum feature size of the one or more lithographic, direct writing or other processes used to form the trenches, as deposition process dimensions are not limited by lithographic processes. One or more insulating layers 322 are contoured to the wave shape of the plurality of trenches, over the first plate layer 321. Chemical vapor deposition may be used to deposit the non-conductive, insulating layer. The thickness of the insulating layer also may be less than the minimum feature size. The insulating layer 322 is followed by a second plate layer 323. The second plate layer 323 may follow the contour of the insulating layer 322, as illustrated, or, alternatively, it may fill in the contour. The second plate layer 323 may be formed by metal sputtering, using the same metal as the first plate layer or a different metal, or, more generally, any conductor. The second plate layer may be formed by sputtering, chemical vapor deposition, or any other contour following process. The thickness of the second plate layer also may be less than the minimum feature size of the trenches. The combined thickness of the first plate, insulating and second plate layers also may be less than the minimum feature size and may be less than half of the minimum feature size. The thicknesses of the various layers may be less along the vertical walls than in the bottom of the trenches or the higher areas between the trenches. In addition to these three layers, additional layers can be added to form a triple plate capacitor, wherein the middle layer serves as one plate opposed to layers above and below it, generally along the lines illustrated in U.S. Pat. No. 6,153,463, entitled "Triple Plate Capacitor and Method for Manufacturing." In a triple plate capacitor, a second insulating layer and a third plate layer are provided. The first and third plate layers may form separate capacitors or may be connected to form a single capacitor. The five layer structure of a triple plate capacitor may be less than the minimum feature size and may be less than half the minimum feature size.

FIG. 3 further illustrates a further patterning layer 326 and an anisotropic etch. The illustrated patterning layer 326 is positioned so that an isolated capacitor will be formed including the illustrated trenches. Depending on the aspect ratio of the trenches, the surface area of the first plate layer may be more than twice the die surface area occupied by the capacitor. The number of trenches and the die surface area allocated to the capacitor can be varied to produce the desired capacitance. In a triple plate capacitor, depending on the aspect ratio of the trenches, the surface area of the effective second plate layer (counting both sides) may be more than three or four times the die surface area occupied by the capacitor.

Figure 4:
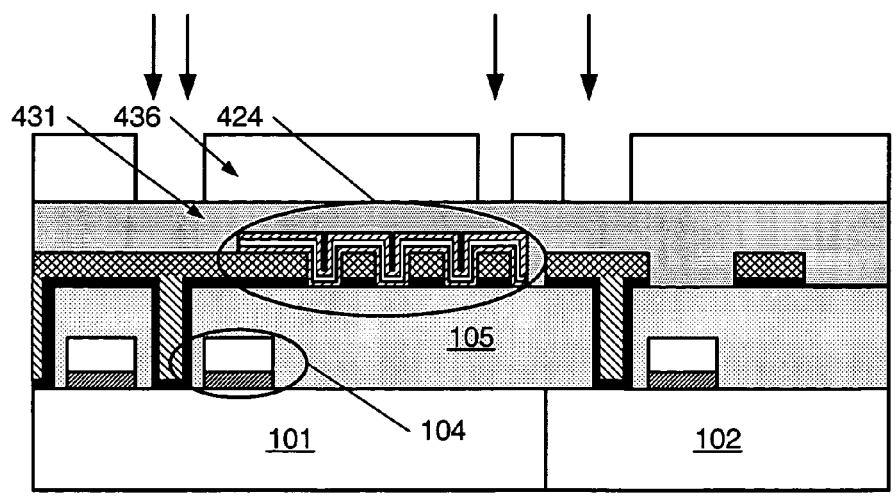
FIG. 4 is a cross section of the same die, with the capacitor layers isolated and covered by an insulator.

FIG. 4 is a cross section of the same die, with the multilayer structure isolated from adjacent structures and covered by an insulator. The multilayer structure 424 has been isolated by an anisotropic etch. The etch step is followed by applying an insulator 431, which may be planarized. The insulator layer 431 may be referred to as an inter-metal dielectric. An additional patterning layer 436 is applied to define contacts with the base conductive layer 212 that was formed prior to the multilayer structure 424.

Figure 5:
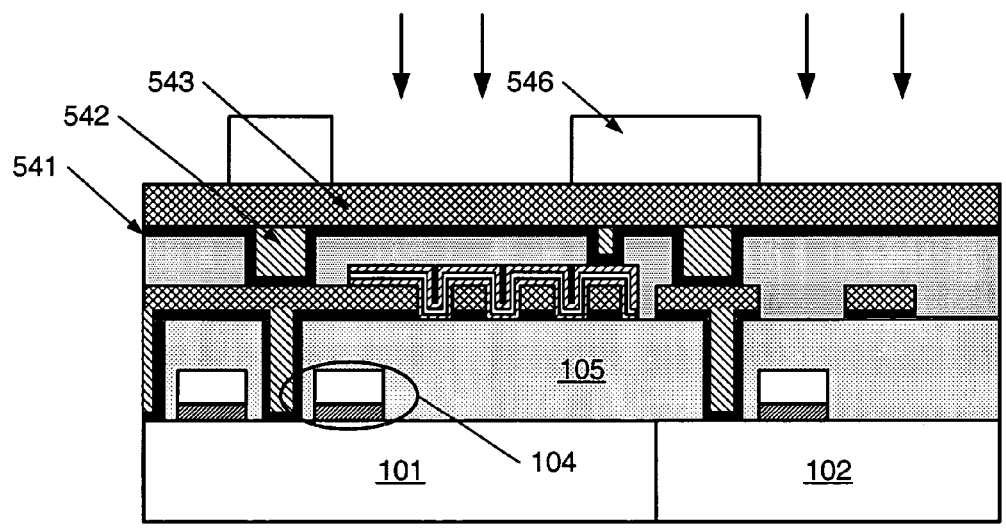
FIG. 5 is a cross section of the same die, with local interconnect metal layers in place.

FIG. 5 is a cross section of the same die, with an interconnect layer in place, ready for further patterning. In some embodiments, the interconnect layer may be a local interconnect layer. Tungsten may be suitable for local interconnects. This interconnect layer may be used not only to connect the capacitor, but also to connect other devices formed on the die. Vias and contact points 542 have been formed by and after the anisotropic etching of FIG. 4. The vias have first received a barrier layer 541. Then, contacts have been formed in the vias 542. A further conductive or metal layer 543 has been formed over the barrier layer 541 and contacts 542. A further patterning layer 546 has been formed over the metal layer, to pattern interconnects. The materials and processes for forming these barrier, contact and conductive layers are similar to the materials and processes illustrated in FIG. 2.

Figure 6:
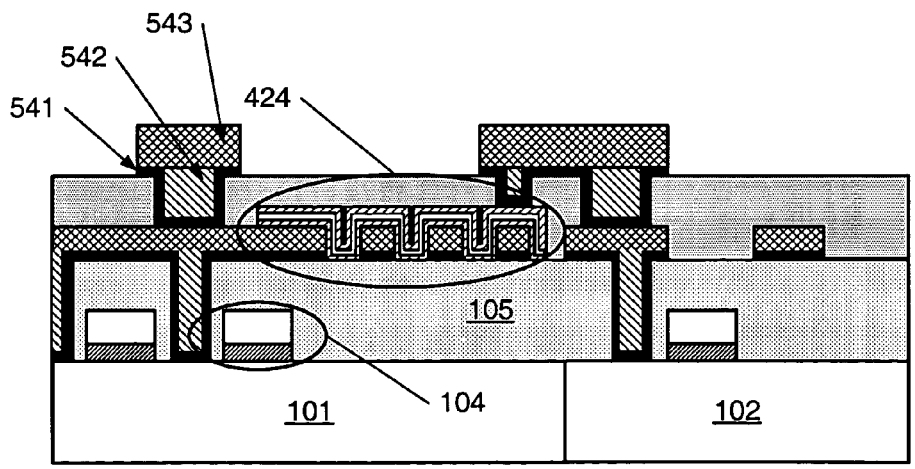
FIG. 6 is a cross section of the same die, with local interconnect metal layers in place and an upper metal layer patterned.

FIG. 6 is a cross section of the same die, with the interconnect layer in place and an upper conductive layer patterned to define the interconnects. The anisotropic etching of FIG. 5 patterns the upper conductive layer 543 in relationship to the contacts 542.

A process embodying the present invention may produce a wave-shaped capacitor over a base conductive layer, said base conductive layer over a base insulator layer on a die. The base conductive layer is patterned to form at least two adjacent trenches. In an alternate embodiment, at least three adjacent trenches may be formed. These trenches may be substantially as deep as the base conductive layer is thick and may substantially cut through the base conductive layer. A multilayer structure is formed, conformed to the trenches. The structure is isolated from adjacent structures, allowing it to effectively serve as a capacitor. The multilayer structure includes a first plate layer, an insulating layer over the first plate layer, and a second plate layer over the insulating layer. Additional layers may be interposed. At least part is a first plate layer is in electrical communication with the base conductive layer. An electrical contact is formed, directly or indirectly, between the base conductive layer and a part of the first plate layer. In this embodiment, a multilayer structure may be formed with a thickness along sidewalls of the trench that is less than half of the trench's width and, more particularly, may be less than a minimum feature size of the lithographic or direct writing process used to form the trenches. It may even be less than half a minimum feature size of the process, especially where the trenches are at or near the minimum lithographic feature size. These dimensions apply at least to three and five layer multilayer structures. The first and second plate layers may be formed by sputtering of metal, such as titanium nitride. The insulating layer may be formed by vapor deposition. The three adjacent trenches, in cross-section, form an essentially rectangular wave shape. The formation the multilayer structure tends to smooth out the wave shape over the rectangular base. The process of producing these wave-shaped capacitors complements other production processes. Contacts and interconnects formed directly below and directly above the multilayer structure are tied to the multilayer structure. The contacts and interconnects that tie to the multilayer structure may be formed throughout the die in one or more layers that interconnect other devices, not just capacitors. The resulting capacitor may be wave shaped, formed over a base conductive layer, the base conductive layer being formed over a base insulator layer on a die. This capacitor includes a wave-shaped pattern in the base conductive layer comprising at least two adjacent trenches. In an alternate embodiment, at least three adjacent trenches may be included in the wave-shaped pattern. A multilayer structure is contoured over the base conductive layer. The multilayer structure includes at least a first plate layer in electrical communication or contact with the base conductive layer, an insulating layer formed over the first plate layer and a second plate layer formed over the insulating layer. It further includes an interconnect layer formed over the multilayer structure, including at least one interconnection with the second plate layer. In some embodiments, the multilayer structure may include additional insulating and plate layers, forming a triple plate capacitor. The multilayer structure may have a thickness along sidewalls of the trenches that is less than a minimum lithographic feature size of a lithographic, direct writing or other process used to form the trenches. For trenches that are near or at the minimum feature size of the process used to form the trenches, the multilayer structure may have a thickness along the sidewalls that is less than one-half of the minimum feature size. The interconnect layer may provide interconnections between other devices on the die, in addition to capacitors.

Figure 7:
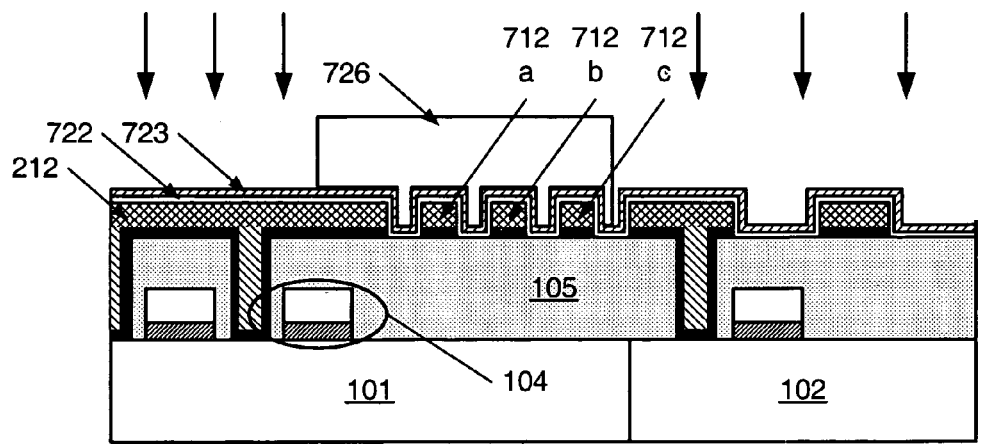
FIG. 7 is a cross section of the same die shown in FIG. 2, with two layers formed for use in a capacitor.

For an alternative embodiment of a wave-shaped capacitor cross-section, FIG. 7 corresponds to FIG. 3. In the alternative embodiment, the initial foundation level, interconnects and trench formation are as shown in FIGS. 1–2. Instead of forming three or five layers over the fingers 712a–c, the base conductive layer serves as a first plate, in this embodiment, reducing the number of layers needed to complete the capacitor. FIG. 7 is a cross section, with two layers formed for use as a capacitor. This figure illustrates trenches resulting from the anisotropic etch illustrated in FIG. 2. Either the base conductive or barrier layer serves as a first capacitor plate. The fingers 712a–c are connected to one another to form a single plate, either by a part of the conductive layer not shown in the cross section, or by the barrier layer. The trenches are filled to form at least two layers. A first capacitor plate layer includes base conductive layer 212 which is in electrical communication with the contact 210. The first plate layer may either be contoured to an undulation or wave shape of the plurality of trenches, if the trenches are not all of the way through the base conductive layer, or may form a wave shape when considered together with an underlying layer, if the trenches are etched all of the way through to form fingers of the base conductive layer. The undulated or wave shape, viewed in profile, may be rectangular, as illustrated, or may be more contoured, due to spacer formation along the trench edges, edge slope or other process factors. This base conductive layer may be formed by metal sputtering. One or more insulating layers 722 are contoured to the undulated or wave shape of the plurality of trenches, over the base conductive layer 212. Chemical vapor deposition may be used to deposit the non-conductive, insulating layer. The thickness of the insulating layer may be less than the minimum feature size, as deposition process dimensions are not limited by lithographic or directing writing processes. The insulating layer 722 is followed by a second plate layer 723. The second plate layer 723 may follow the contour of the insulating layer 722, as illustrated, or, alternatively, it may fill in the contour. The second plate layer 723 may be formed by metal sputtering. Suitable metals include titanium nitride, or, more generally, any conductor. Alternatively, another technology such as chemical vapor deposition or physical vapor deposition may be adapted to deposit the conductive second plate layer 723. The thickness of the second plate layer may be less than the minimum lithographic feature size of the trenches, as deposition process dimensions are not limited by lithographic processes. The combined thickness of the insulating and second plate layers also may be less than the minimum feature size and may be less than half the minimum feature size. The thicknesses of the various layers may be less along the vertical walls than in the bottom of the trenches or the higher areas between the trenches. Alternatively, additional insulating and plate layers may be supplied to form a triple plate capacitor. FIG. 7 further illustrates a further patterning layer 726 and an anisotropic etch. The illustrated patterning layer 726 is positioned so that an isolated capacitor will be formed including three illustrated trench features. Depending on the aspect ratio of the trenches, the surface area of the first plate layer may be more than twice the die surface area occupied by the capacitor. For a triple plate capacitor, the effective surface area may be more than four times the die surface area occupied. The number of trenches and the die surface area allocated to the capacitor can be varied to produce the desired capacitance.

Figure 8:
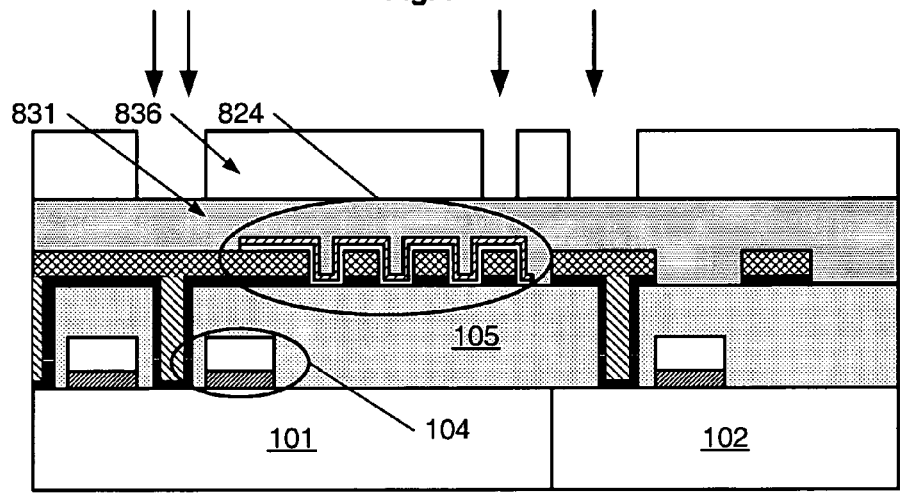
FIG. 8 is a cross section of the same die, with the capacitor layers isolated and covered by an insulator.

FIG. 8 is a cross section of the same die, with the multilayer structure isolated from adjacent structures and covered by an insulator. The multilayer structure 824 has been isolated by an anisotropic etch. The etch step is followed by applying an insulator 831, which may be planarized. The insulator layer 831 may be referred to as an inter-metal dielectric. An additional patterning layer 836 is applied to define contacts with the base conductive layer 212 formed prior to the multilayer structure 824.

Figure 9:
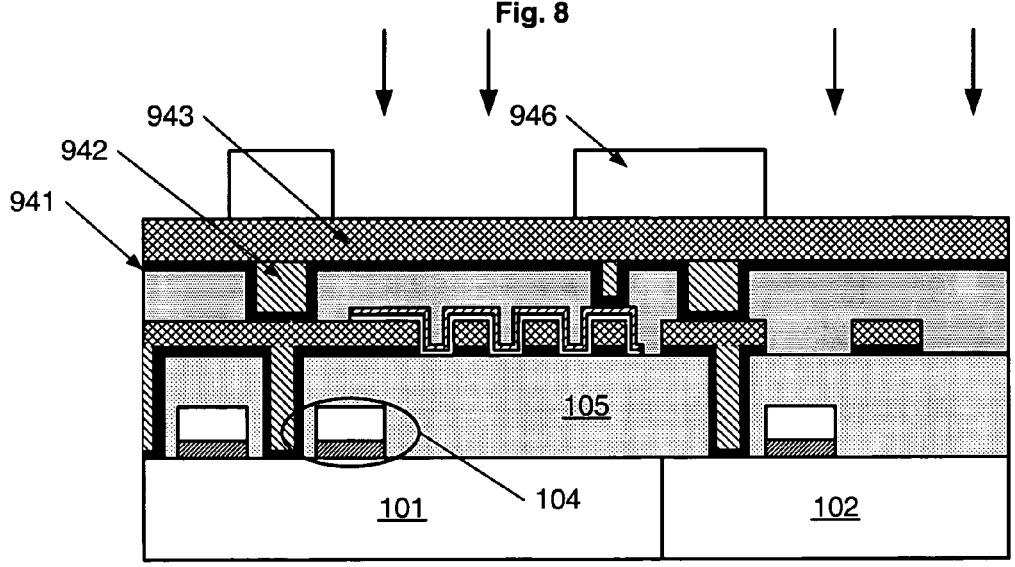
FIG. 9 is a cross section of the same die, with local interconnect metal layers in place.

FIG. 9 is a cross section of the same die, with an interconnect layer in place, ready for further patterning. In some embodiments, the interconnect layer may be a local interconnect layer. For local interconnects, tungsten may be suitable. This interconnect layer may be used not only to connect the capacitor, but also to connect other devices formed on the die. Vias and contact points 942 have been formed by and after the anisotropic etching of FIG. 8. The vias have received a barrier layer 941. Then, contacts have been formed in the vias 942. A further conductive or metal layer 943 has been formed over the barrier layer 941 and contacts 942. A further patterning layer 946 has been formed over the metal layer, to complete interconnects. The materials and processes for forming these barrier, contact and conductive layers are similar to the materials and processes illustrated in FIG. 2.

Figure 10:
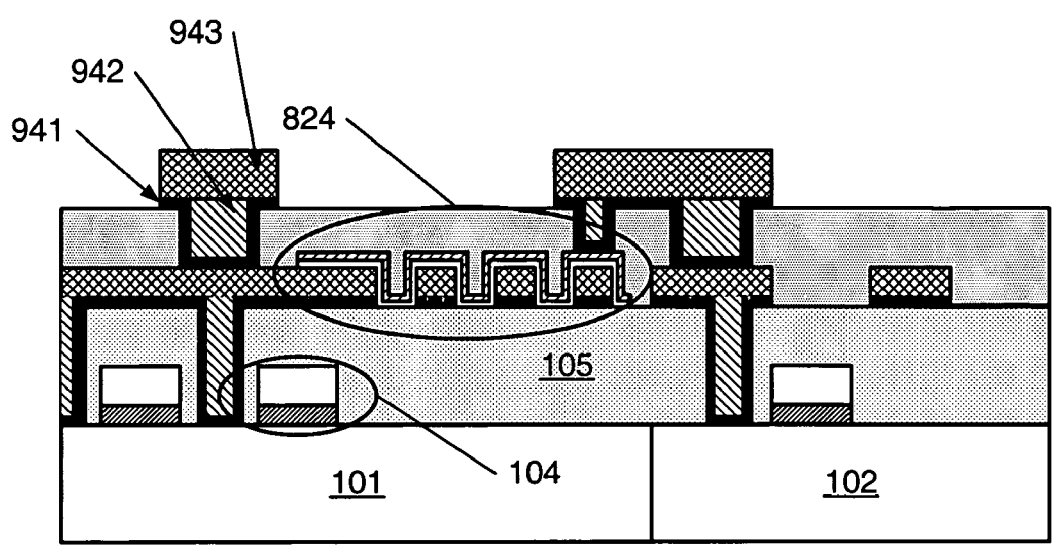
FIG. 10 is a cross section of the same die, with local interconnect metal layers in place and an upper metal layer patterned.

FIG. 10 is a cross section of the same die, with the interconnect layer in place and the top conductive layer patterned to define the interconnects. The anisotropic etching of FIG. 9 patterns the top conductive layer 943 in relationship to the contacts 942.

A process embodying the present invention may produce a wave-shaped capacitor over a base conductive layer, said base conductive layer over a base insulator layer on a die. The base conductive layer is patterned to form at least two adjacent trenches, the sides of which are electrically connected. In an alternative embodiment, at least three adjacent trenches are formed. These trenches may be substantially as deep as the base conductive layer is thick and may substantially cut through the base conductive layer. A multilayer structure is formed, conformed to the trenches. The structure is isolated from adjacent structures, allowing it to effectively serve as a capacitor. The multilayer structure includes the base conductive layer, an insulating layer over the base conductive layer, and a second plate layer over the insulating layer. Additional layers may be interposed or added over the second plate layer, for instance, to form a triple plate capacitor. In this embodiment, a multilayer structure may be formed with a thickness along sidewalls of the trench is which is less than half of the trench width and, more particularly, may be less than a minimum lithographic feature size of the lithographic process used to form the trenches. It may even be less than half a minimum lithographic feature size of the lithographic process, especially where the trenches are at or near the minimum lithographic feature size. The second plate layer may be formed by sputtering of metal, such as titanium nitride. The insulating layer may be formed by vapor deposition. The adjacent trenches, in cross-section, form an essentially rectangular wave shape. The formation the multilayer structure tends to smooth out the wave shape over the rectangular base. The process of producing these wave-shaped capacitors complements other production processes. Contacts and interconnects formed directly below and directly above the multilayer structure are tied to the multilayer structure. The contacts and interconnects that tie to the multilayer structure may be formed throughout the die in one or more layers that interconnect other devices, not just capacitors.

The resulting capacitor may be wave shaped, formed over a base conductive layer, the base conductive layer being formed over a base insulator layer on a die. This capacitor includes a wave-shaped pattern in the base conductive layer comprising at least two adjacent trenches. In an alternative embodiment, the wave-shaped pattern includes at least three trenches. A multilayer structure is contoured over the base conductive layer. The multilayer structure includes at least an insulating layer formed over the base conductive layer and a second plate layer formed over the insulating layer, and may include additional insulating and plate layers. It further includes an interconnect layer formed over the multilayer structure, including at least one interconnection with the second plate layer. The multilayer structure of the device may have a thickness along sidewalls of the trenches that is less than a minimum feature size of a lithographic, direct writing or other process used to form the trenches. For trenches that are near or at the minimum lithographic feature size of the lithographic process used to form the trenches, the multilayer structure may have a thickness along the sidewalls that is less than one-half of the minimum feature size. The interconnect layer may provide interconnections between other devices on the die, in addition to capacitors.

While the present invention is disclosed by reference to the preferred embodiments and examples detailed above, it is understood that these examples are intended in an illustrative rather than in a limiting sense. It is contemplated that modifications and combinations will readily occur to those skilled in the art, which modifications and combinations will be within the spirit of the invention and the scope of the following claims.

We claim:

1. A wave-shaped capacitor, formed over a base conductive layer, said base conductive layer over a base insulator layer on a die, the capacitor including:
    a wave-shaped pattern in the base conductive layer comprising at least two adjacent trenches in the base conductive layer;
    a multilayer structure contoured over the base conductive layer, the multilayer structure comprising:
        a first metal plate layer in electrical contact with the base conductive layer;
        an insulating layer over the first plate layer;
        a second metal plate layer over the insulating layer; and
        an interconnect layer over the multilayer structure, including at least one interconnection with the second plate layer.

2. The device of claim 1, wherein the at least two adjacent trenches are formed by a lithographic or direct writing process and the multilayer structure has a thickness along the sidewalls of the trench that is less than half of a minimum feature size of the lithographic or direct writing process.

3. The device of claim 1, wherein the base conductive layer and the first metal plate layer are the same structure.

4. The device of claim 3, wherein the at least two adjacent trenches are formed by a lithographic or direct writing process and the multilayer structure has a thickness along the sidewalls of the trench that is less than half of a minimum feature size of the lithographic or direct writing process.

* * * * *